US012512595B2

(12) United States Patent
Shao et al.

(10) Patent No.: US 12,512,595 B2
(45) Date of Patent: Dec. 30, 2025

(54) ANTENNA AND COMMUNICATION DEVICE

(71) Applicant: HUAWEI TECHNOLOGIES CO., LTD., Shenzhen (CN)

(72) Inventors: Jinjin Shao, Wuhan (CN); Cao Shi, Dongguan (CN); Junfei He, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 278 days.

(21) Appl. No.: 18/336,214

(22) Filed: Jun. 16, 2023

(65) Prior Publication Data

US 2023/0327341 A1 Oct. 12, 2023

Related U.S. Application Data

(63) Continuation of application No. PCT/CN2021/124761, filed on Oct. 19, 2021.

(30) Foreign Application Priority Data

Dec. 22, 2020 (CN) ......................... 202011529058.7

(51) Int. Cl.
*H01Q 9/26* (2006.01)
*H01P 3/08* (2006.01)
*H03H 7/42* (2006.01)

(52) U.S. Cl.
CPC ............... *H01Q 9/26* (2013.01); *H01P 3/081* (2013.01); *H03H 7/42* (2013.01)

(58) Field of Classification Search
CPC ............ H01Q 9/26; H01Q 9/20; H01Q 9/065; H01Q 11/105; H01Q 21/0037; H01Q 19/30; H01Q 1/38; H01Q 1/50; H01P 3/081
See application file for complete search history.

(56) References Cited

U.S. PATENT DOCUMENTS 3,573,839 A 4/1971 Parker, Jr.
4,754,287 A 6/1988 Shelton et al.
(Continued)

FOREIGN PATENT DOCUMENTS

CN 201323236 Y 10/2009
CN 101710652 A 5/2010
(Continued)

OTHER PUBLICATIONS

Wang et al., "W-Band Millimeter-Wave on-Chip Log-Periodic Dipole Antenna with Integrated Balun Filter in GIPD Process", 48th European Microwave Conference, European Microwave Association, Sep. 25-27, 2018, XP033450360, 4 pages.
(Continued)

*Primary Examiner* — Awat M Salih
(74) *Attorney, Agent, or Firm* — Maier & Maier, PLLC

(57) ABSTRACT

An antenna and a communication device. The antenna provided includes a dielectric substrate, a folded dipole, and N symmetrical dipoles. A combined line is disposed on the dielectric substrate, and the combined line has a first end and a second end. The folded dipole is located at the first end of the combined line and is connected to the combined line. The N symmetrical dipoles are disposed on the dielectric substrate, and the N symmetrical dipoles are connected to the combined line. The N symmetrical dipoles are sequentially arranged from the first end to the second end of the combined line.

17 Claims, 10 Drawing Sheets

(56) References Cited

U.S. PATENT DOCUMENTS

| | | | | |
|---|---|---|---|---|
| 6,025,811 | A | 2/2000 | Canora et al. | |
| 7,286,097 | B1 * | 10/2007 | Van Buren | H01Q 19/30 343/810 |
| 8,502,747 | B2 | 8/2013 | Chang et al. | |
| 8,558,748 | B2 | 10/2013 | Chen et al. | |
| 9,257,741 | B2 | 2/2016 | Cheng | |
| 2015/0070228 | A1 * | 3/2015 | Gu | H01Q 25/00 343/727 |

FOREIGN PATENT DOCUMENTS

| | | | |
|---|---|---|---|
| CN | 202121058 | U | 1/2012 |
| CN | 102394352 | A | 3/2012 |
| GB | 983447 | A | 2/1965 |
| JP | 02092216 | U | 7/1990 |
| JP | H101272 | A | 1/1998 |
| JP | 2011041318 | A | 2/2011 |
| JP | 2014150334 | A | 8/2014 |
| KR | 1020090115253 | A | 11/2009 |

OTHER PUBLICATIONS

Wen et al., "A Novel Printed Log-Periodic Dipole Array Based on Composite Right-Left Handed Transmission Line", Perspective Technologies and Methods in MEMS Design (MEMSTECH), 2011 Proceedings of VIIth International Conference, IEEE, May 11-14, 2011, XP031903113, 4 pages.

* cited by examiner

ANTENNA AND COMMUNICATION DEVICE

CROSS-REFERENCE TO RELATED APPLICATIONS

This application is a continuation of International Application No. PCT/CN2021/124761, filed on Oct. 19, 2021, which claims priority to Chinese Patent Application No. 202011529058.7, filed on Dec. 22, 2020. The disclosures of the aforementioned applications are hereby incorporated by reference in their entireties.

TECHNICAL FIELD

The embodiments relate to the field of communication technologies and to an antenna and a communication device.

BACKGROUND

In a current wireless communication device, half-wave dipole antennas are mainly used. As a type of common narrowband antennas, the half-wave dipole antennas feature horizontal omnidirectional radiation and the like, and a maximum gain is about 2 dBi. In an actual application, a half-wave dipole antenna generally includes a pair of symmetrically provided conductors, and two ends of the two conductors close to each other are respectively connected to feeders, where a sum of lengths of the two conductors is approximately equal to half of an operating frequency of the two conductors. As the operating frequency of the antenna increases, a frequency of an electromagnetic wave emitted by the antenna increases accordingly. However, compared with a low-frequency electromagnetic wave, a high-frequency electromagnetic wave attenuates significantly under a same propagation distance, and has poor winding and wall penetration capabilities. However, because a frequency of the electromagnetic wave emitted by the half-wave dipole is highly related to a size and height of the half-wave dipole, the half-wave dipole antenna can generate only a beam with a single frequency band, and has low gains in a perpendicular direction, failing to achieve coverage of an entire area.

SUMMARY

The embodiments may include an antenna and a communication device that have wide coverage and are favorable to achieve a high gain and a multi-beam characteristic.

According to one aspect, the embodiments include an antenna. The antenna includes a dielectric substrate, a combined line, a folded dipole, and N symmetrical dipoles. The combined line is disposed on the dielectric substrate. The combined line has a first end and a second end. The folded dipole is disposed on the dielectric substrate. The folded dipole is located at the first end of the combined line and is connected to the combined line. The N symmetrical dipoles are disposed on the dielectric substrate. The N symmetrical dipoles are connected to the combined line, and N is an integer greater than or equal to 1. When N is greater than 1, the N symmetrical dipoles are sequentially arranged from the first end to the second end of the combined line.

In the antenna provided in the embodiments, the folded dipole has a relatively strong radiation gain in a perpendicular direction, and the symmetrical dipole features horizontal omnidirectional radiation and the like. Coherent superposition can be implemented, by arranging the folded dipole and the symmetrical dipole according to a specific dimension constraint, on electromagnetic waves generated by the folded dipole and the symmetrical dipole, achieving a multi-beam characteristic. Therefore, superposition between the folded dipole and the symmetrical dipole is beneficial to achieve multi-directional coverage of the antenna. For example, applying a wireless router equipped with the foregoing antenna to a multi-story structure help ensure coverage of a Wi-Fi signal on a same floor, and also improve coverage of a Wi-Fi signal on an upper floor and a lower floor.

During specific disposition, a distance L between the folded dipole and the symmetrical dipole at a tail part may be adaptively adjusted according to an actual condition. For example, the distance L may be greater than or equal to a quarter of an operating wavelength of the antenna, and may be less than or equal to the operating wavelength of the antenna. In this way, coherent superposition can be implemented on electromagnetic waves generated by the folded dipole and the symmetrical dipole at the tail part, achieving a multi-beam characteristic.

The symmetrical dipole at the tail part is a symmetrical dipole that is furthest from the folded dipole among the plurality of symmetrical dipoles. Alternatively, it may be understood that the symmetrical dipole at the tail part is a symmetrical dipole located at the second end of the combined line.

When a plurality of symmetrical dipoles are disposed, the plurality of symmetrical dipoles may be arranged according to a specific dimension constraint.

For example, lengths between the plurality of symmetrical dipoles may be set according to a dimension constraint in the following formula.

$$\frac{L_n}{L_{n+1}} = \hat{o} < 1 \qquad \text{Formula (1)}$$

Alternatively, relative positions between the plurality of symmetrical dipoles may be arranged according to the dimension constraint in the following formula.

$$\frac{R_n}{R_{n+1}} = \hat{o} < 1 \qquad \text{Formula (2)}$$

Alternatively, the relative positions between the plurality of symmetrical dipoles may be arranged according to the dimension constraint in the following formula.

$$\frac{d_n}{d_{n+1}} = \hat{o} < 1 \qquad \text{Formula (3)}$$

N is a sequence number of the symmetrical dipole, and increases sequentially from a left end to a right end of the combined line. $L_n$ is a length of an $n^{th}$ symmetrical dipole. $L_{n+1}$ is a length of an $(n+1)^{th}$ symmetrical dipole. $R_n$ is a distance from the $n^{th}$ symmetrical dipole to a virtual vertex of the antenna. $R_{n+1}$ is a distance from the $(n+1)^{th}$ symmetrical dipole to the virtual vertex of the antenna. $d_n$ is a distance between the $n^{th}$ symmetrical dipole and the $(n+1)^{th}$ symmetrical dipole. $d_{n+1}$ is a distance between the $(n+1)^{th}$ symmetrical dipole and an $(n+2)^{th}$ symmetrical dipole. $\tau$ is a combination factor of the antenna. In an application, a value of $\tau$ may be appropriately selected based on an actual requirement. For example, the value oft may be 0.5, 0.6, 0.7, or the like. This is not limited.

It may be understood that, during specific setting, the plurality of symmetrical dipoles may satisfy only any dimension constraint in the foregoing formulas (1) to (3), or may simultaneously satisfy any one or two or three dimension constraints in the foregoing formulas. Alternatively, the setting may be performed according to another dimension constraint. This is not limited in the embodiments.

In some implementations, the dielectric substrate may be a structure such as a printed circuit board or a flexible circuit board. The combined line may be formed on the dielectric substrate by using a process such as photolithography. The combined line includes a first microstrip and a second microstrip, and a gap is maintained. Width sizes of the first microstrip and the second microstrip may be the same, so as to ensure operating stability of the symmetrical dipole and the folded dipole. In a an implementation, the combined line may also be referred to as a parallel strip line. The first microstrip and the second microstrip may maintain a mutually parallel or an approximately parallel relationship.

In addition, the symmetrical dipole may include a first vibration arm and a second vibration arm, and the first vibration arm and the second vibration arm are symmetrically configured relative to the combined line. The first vibration arm may be disposed on a side of the first microstrip, and an end that is of the first vibration arm and that is close to the first microstrip is connected to the first microstrip. The second vibration arm may be disposed on a side of the second microstrip, and an end that is of the second vibration arm and that is close to the second microstrip is connected to the second microstrip.

During specific disposition, the symmetrical dipole at the tail part may be used as an excitation unit of the antenna. To satisfy a connection between the antenna and a related feed component, the antenna may be connected through one end of a coaxial cable, and the other end of the coaxial cable may be connected to the related feed component. The coaxial cable generally includes a cable core and an outer conductor located on the periphery of the cable core. Therefore, the symmetrical dipole at the tail part may be provided with a feed end. For example, the first vibration arm may have a first feed end, and the first feed end is located at an end that is of the first vibration arm and that faces the second vibration arm. The second vibration arm may have a second feed end, and the second feed end is located at an end that is of the second vibration arm and that faces the first vibration arm.

Considering that in the coaxial cable, a size of the outer conductor is greater than a size of the cable core, unbalanced feeding occurs when the coaxial cable is connected to the antenna. Therefore, during specific disposition, a balun structure may be further disposed in the antenna, to balance feeding.

During specific disposition, the balun structure may be disposed on a side that is of the symmetrical dipole at the tail part and that is away from the folded dipole, and is connected to the symmetrical dipole at the tail part. A specific structure type of the balun structure can be appropriately selected and adjusted based on different requirements. For example, the balun structure may be a bent U-shaped structure, and one end of the balun structure may be connected to the first vibration arm, the other end may be connected to the second vibration arm.

Alternatively, in another implementation, the problem of unbalanced feeding may be tackled using other structure setting.

For example, an end close to the first vibration arm and an end close to the second vibration arm may be connected to each other, and a slot exists between the first vibration arm and the second vibration arm. An end that is of the first vibration arm and that is close to the first microstrip may be connected to the first microstrip line, and an end of the second microstrip may extend into the slot. During connecting, the outer conductor of the coaxial cable may be connected to the first feed end on the first vibration arm or the second vibration arm, and an inner conductor of the coaxial cable may be connected to the second microstrip. Therefore, feeding is performed between the antenna and the coaxial cable by implementing a coplanar waveguide, so as to balance feeding between the antenna and the coaxial cable.

In addition, during specific disposition, relatively common folded dipoles in conventional technologies may be used for the folded dipoles, or flexible processing may be performed on the folded dipoles.

For example, the folded dipole may include a first connecting arm and a second connecting arm. The first connecting arm and the second connecting arm are coaxially disposed, and the first connecting arm and the second connecting arm are symmetrically configured relative to the combined line. An end of the first connecting arm is connected to the first microstrip, and an end of the second connecting arm is connected to the second microstrip.

In addition, an operating wavelength of the folded dipole may be increased. During specific disposition, the first connecting arm of the folded dipole further has a first extension section extending in a direction away from the second connecting arm. The second connecting arm has a second extension section extending in a direction away from the first connecting arm. The operating wavelength of the folded dipole may be increased by setting the first extension section and the second extension section. Specific lengths of the first extension section and the second extension section may be set based on an actual condition. This is not limited in the embodiments.

According to another aspect, an embodiment further provides a communication device. The communication device includes a signal processing circuit and the foregoing antenna. The signal processing circuit may be electrically connected to the antenna through a coaxial cable. The communication device may be a wireless router, a mobile phone, a tablet computer, or the like. The signal processing circuit is electrically connected to the antenna to input or output a radio frequency signal. The electronic device has better antenna performance, and is capable of achieving a relatively wide frequency band and omnidirectional coverage.

DETAILED DESCRIPTION OF THE EMBODIMENTS

Figure 1:
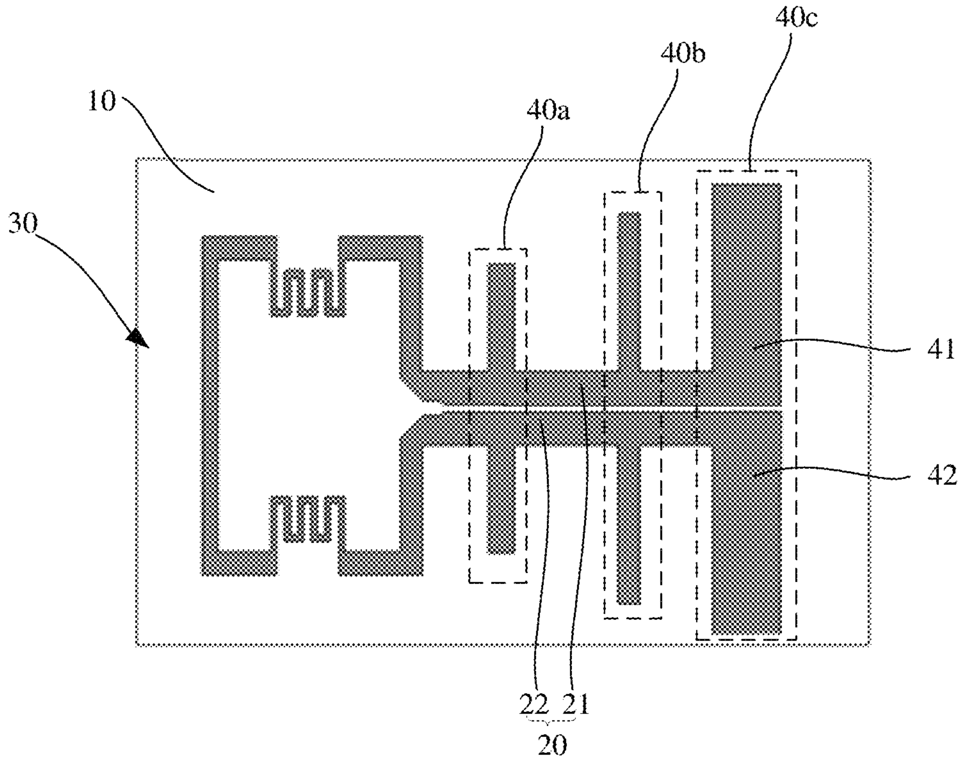
FIG. 1 is a schematic diagram of a planar structure of an antenna according to an embodiment.

To make the objectives, solutions, and advantages of clearer, the following further describes the embodiments in detail with reference to the accompanying drawings.

To facilitate understanding of the antenna provided in embodiments, the following first describes an application scenario of the antenna.

The antenna provided in embodiments may be used in a communication device and is configured to enable the communication device to receive or send a wireless signal, to implement a wireless communication function. The communication device may be a wireless router, a mobile phone, a tablet computer, a notebook computer, a vehicle-mounted device, a wearable device, or the like.

A router is used as an example. The router usually generates a Wi-Fi signal with specific coverage using an antenna. Devices such as a mobile phone and a tablet computer within the coverage may implement signal interconnection with the router. To achieve higher-rate signal transmission, the Wi-Fi signal gradually covers a frequency band from 2G to 5G or even a higher frequency band. In the current routers, half-wave dipole antennas can be used. As a type of common narrowband antennas, the half-wave dipole antennas feature horizontal omnidirectional radiation and the like, and a maximum gain is about 2 dBi. As an operating frequency of the antenna increases, the frequency of the electromagnetic wave emitted by the antenna increases accordingly. However, compared with a low-frequency electromagnetic wave, a high-frequency electromagnetic wave attenuates significantly under a same propagation distance, and has poor winding and wall penetration capabilities. However, because a frequency of the electromagnetic wave emitted by the half-wave dipole is highly related to a size and height of the half-wave dipole, the half-wave dipole antenna can generate only a beam with a single frequency band, and has low gains in a perpendicular direction, failing to achieve coverage of an entire area.

In addition, a common directional antenna usually presents a single-beam characteristic, and coverage of the directional antenna is reduced when a gain is improved. Correspondingly, in a process of increasing the coverage of the directional antenna, the gain of the directional antenna is significantly reduced. Therefore, for the directional antenna, more gains indicate smaller coverage, and therefore an effect of high gains and large coverage cannot be achieved simultaneously.

Therefore, an embodiment provides an antenna that has a relatively large gain and is beneficial to achieve omnidirectional coverage.

Terms used in the following embodiments are merely intended to describe embodiments, but are not intended as limiting. The expressions “one”, “one”, “the above”, “the” and “this” are intended to also include such expressions as “one or more”, unless the context clearly indicates to the contrary. It should be further understood that in the following embodiments, “at least one” and “one or more” refer to one, two, or more. The term “and/or” is used for describing an association relationship between associated objects, and indicates that three relationships may exist. For example, A and/or B may represent: only A exists, both A and B exist, and only B exists, where A and B may be singular or plural. The character “/” generally indicates that the associated objects are in an “or” relationship.

Reference to “an embodiment”, “some embodiments”, or the like indicates that one or more embodiments include a characteristic, structure, or feature described with reference to the embodiment. Therefore, statements “in one embodiment”, “in some embodiments”, “in some other embodiments”, “in other embodiments” and the like do not necessarily refer to the same embodiment, but rather means “one or more but not all embodiments”, unless otherwise specifically emphasized. The terms “include”, “comprise”, “have”, and variations thereof all mean “including, but not limited to”, unless otherwise specifically emphasized.

As shown in FIG. 1, in an embodiment provided, an antenna includes a dielectric substrate 10, a folded dipole 30, and three symmetrical dipoles. The three symmetrical dipoles are respectively a symmetrical dipole 40*a*, a symmetrical dipole 40*b*, and a symmetrical dipole 40*c*. A combined line 20 is disposed on the dielectric substrate 10, and the folded dipole 30, the symmetrical dipole 40*a*, the symmetrical dipole 40*b*, and the symmetrical dipole 40*c* are all disposed on the dielectric substrate 10 and connected to the combined line 20. The folded dipole 30, the symmetrical dipole 40*a*, the symmetrical dipole 40*b*, and the symmetrical dipole 40*c* may be configured to convert current energy into electromagnetic energy and radiate the electromagnetic energy, and a distance L between the symmetrical dipole 40*c* and the folded dipole 30 may be provided according to a specific dimension constraint, so as to form a series-fed binary antenna array design. The symmetrical dipole 40*a* and the symmetrical dipole 40*b* are disposed between the folded dipole 30 and the symmetrical dipole 40*c*, and the symmetrical dipole 40*a* and the symmetrical dipole 40*b* are sequentially arranged from the folded dipole 30 to the symmetrical dipole 40*c*. A radiation capability of the symmetrical dipole 40*c* to a direction of the folded dipole 30 can be effectively improved by the symmetrical dipole 40*a* and the symmetrical dipole 40*b*, and bandwidth of the antenna can also be effectively increased.

In an embodiment, the folded dipole 30 has a relatively strong radiation gain in a perpendicular direction, and the symmetrical dipole 40*c* features horizontal omnidirectional radiation and the like. Coherent superposition can be implemented by arranging the folded dipole 30 and the symmetrical dipole 40*c* according to a specific dimension constraint, on electromagnetic waves generated by the folded dipole 30 and the symmetrical dipole 40*c*, achieving a multi-beam characteristic. Therefore, superposition between the folded dipole 30 and the symmetrical dipole 40*c* is beneficial to achieve multi-directional coverage of the antenna. For example, applying a wireless router equipped with the foregoing antenna to a multi-story structure help ensure coverage of a Wi-Fi signal on a same floor, and also improve coverage of a Wi-Fi signal on an upper floor and a lower floor.

Generally speaking, in an actual application, the antenna may include the folded dipole 30 and N symmetrical dipoles, where N is an integer greater than or equal to 1. The folded dipole 30 may be disposed at the first end (the left part in the figure) of the combined line 20, and the N symmetrical dipoles may be sequentially arranged from a first end to a second end (that is, from left to right) of the combined line 20.

In an implementation, the dielectric substrate 10 may be a structure such as a printed circuit board or a flexible circuit board. The combined line 20 may be formed on the dielectric substrate 10 by using a process such as photolithography. The combined line 20 includes a first microstrip 21 and a second microstrip 22, and there is a gap between the first microstrip 21 and the second microstrip 22. Width sizes of the first microstrip 21 and the second microstrip 22 may be the same, to ensure operating stability of the symmetrical dipole 40 and the folded dipole 30. In an implementation, the combined line 20 may also be referred to as a parallel strip line. The first microstrip 21 and the second microstrip 22 may be in a parallel or an approximately parallel relationship.

As shown in FIG. 1, when the symmetrical dipole 40*c* is specifically disposed, the symmetrical dipole 40*c* may include a first vibration arm 41 and a second vibration arm 42, and the first vibration arm 41 and the second vibration arm 42 are symmetrically configured relative to the combined line 20. The first vibration arm 41 and the second vibration arm 42 may be disposed coaxially, and an end of the first vibration arm 41 is connected to the first microstrip 21, and an end of the second vibration arm 42 is connected to the second microstrip 22. The symmetrical dipole may also be understood as a dipole, a half-wave dipole, or the like. Symmetrical disposition of the first vibration arm 41 and the second vibration arm 42 means symmetry in positions. In specific implementation, structural sizes of the first vibration arm 41 and the second vibration arm 42 may be the same or different.

Figure 2:
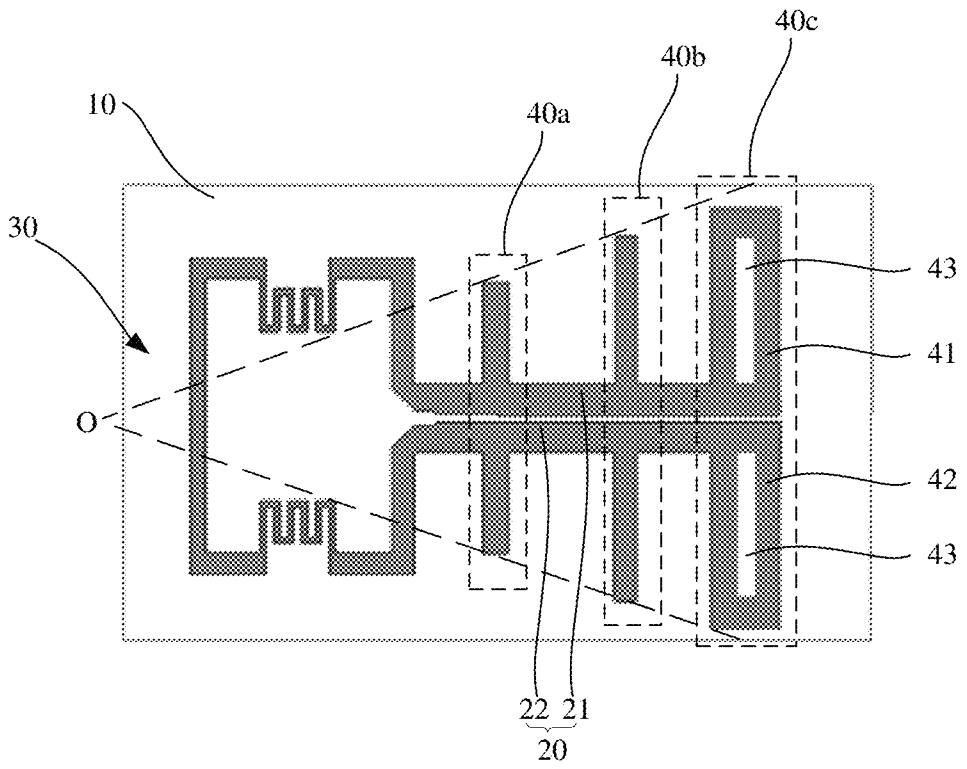
FIG. 2 is a schematic diagram of a planar structure of another antenna according to an embodiment.

As shown in FIG. 2, in another disposition manner, a gap 43 may be further provided in a first vibration arm 41 and a second vibration arm 42, to perform capacitive loading on a symmetrical dipole 40*c*, thereby optimizing operating performance of the symmetrical dipole 40*c*.

A symmetrical dipole 40*a* and a symmetrical dipole 40*b* may be disposed in a same manner or similar manners according to a structure of the foregoing symmetrical dipole 40*c*, and details are not described herein again.

During specific disposition, a distance L between the symmetrical dipole 40*c* and a folded dipole 30 may range from a quarter of an operating wavelength of an antenna to an entire operating wavelength. In this way, coherent superposition can be implemented on electromagnetic waves generated by the folded dipole 30 and the symmetrical dipole 40*c*, achieving a multi-beam characteristic.

In addition, during specific disposition, the symmetrical dipole 40*a*, the symmetrical dipole 40*b*, and the symmetrical dipole 40*c* may be disposed according to a specific dimension constraint, so as to effectively improve a radiation capability of the symmetrical dipole 40*c* to a direction of the folded dipole 30, and bandwidth of the antenna can also be effectively increased.

For example, in an embodiment, lengths between the symmetrical dipole 40*a*, the symmetrical dipole 40*b*, and the symmetrical dipole 40*c* may be arranged in a form of a logarithmic period. For example, the symmetrical dipole 40*a*, the symmetrical dipole 40*b*, and the symmetrical dipole 40*c* may be arranged by satisfying a dimension constraint in the following formula.

$$\frac{L_n}{L_{n+1}} = \hat{o} < 1 \qquad \text{Formula (1)}$$

N is a sequence number of the symmetrical dipole, and increases sequentially from a left end to a right end of the combined line 20. That is, the symmetrical dipole 40*a* is a first symmetrical dipole, the symmetrical dipole 40*b* is a second symmetrical dipole, and the symmetrical dipole 40*c* is a third symmetrical dipole.

$L_n$ is a length of an $n^{th}$ symmetrical dipole. $L_{n+1}$ is a length of an $(n+1)^{th}$ symmetrical dipole. For example, in the symmetrical dipole 40*c*, a length of the symmetrical dipole 40*c* is a sum of lengths of the first vibration arm 41 and the second vibration arm 42. Generally, the length of the symmetrical dipole 40*c* is approximately equal to half of the wavelength of electromagnetic waves transmitted or received by the symmetrical dipole 40*c*.

$\tau$ is a combination factor of the antenna. In an application, a value of $\tau$ may be appropriately selected based on an actual requirement. For example, the value of $\tau$ may be 0.5, 0.6, 0.7, or the like. This is not limited.

In some other implementations, the symmetrical dipole 40*a* and the symmetrical dipole 40*b* may be disposed according to a specific dimension constraint, so as to effectively improve the radiation capability of the symmetrical dipole 40*c* to the direction of the folded dipole 30, and bandwidth of the antenna can also be effectively increased.

For example, in an embodiment provided, relative positions between the symmetrical dipole 40*a*, the symmetrical dipole 40*b*, and the symmetrical dipole 40*c* may be arranged in the form of the logarithmic period. For example, the symmetrical dipole 40*a*, the symmetrical dipole 40*b*, and the symmetrical dipole 40*c* may be arranged by satisfying a dimension constraint in the following formula.

$$\frac{R_n}{R_{n+1}} = \hat{o} < 1 \qquad \text{Formula (2)}$$

N is the sequence number of the symmetrical dipole, and increases sequentially from the left end to the right end of the combined line 20. That is, the symmetrical dipole 40*a* is the first symmetrical dipole, the symmetrical dipole 40*b* is the second symmetrical dipole, and the symmetrical dipole 40*c* is the third symmetrical dipole. $R_n$ is a distance from the $n^{th}$ symmetrical dipole to a virtual vertex O of the antenna. $R_{n+1}$ is a distance from the $(n+1)^{th}$ symmetrical dipole to the virtual vertex O of the antenna. In an antenna structure shown in FIG. 2, the symmetrical dipole 40*a*, the symmetrical dipole 40*b*, and the symmetrical dipole 40*c* have lengths decreasing in order. Therefore, top ends of the symmetrical dipole 40*a*, the symmetrical dipole 40*b*, and the symmetrical dipole 40*c* located on an upper side of the combined line 20 are located on the same straight line. Correspondingly, top ends (lower ends in the figure) of the symmetrical dipole 40*a*, the symmetrical dipole 40*b*, and the symmetrical dipole 40*c* located on a lower side of the combined line 20 are also located on the same straight line. An intersection of the two straight lines forms the virtual vertex O.

$\tau$ is the combination factor of the antenna. In an application, the value of $\tau$ may be appropriately selected based on the actual requirement. For example, the value of $\tau$ may be 0.5, 0.6, 0.7, or the like. This is not limited.

In some other implementations, the symmetrical dipole 40*a* and the symmetrical dipole 40*b* may be disposed according to another dimension constraint, so as to effectively improve the radiation capability of the symmetrical dipole 40*c* to the direction of the folded dipole 30, and bandwidth of the antenna can also be effectively increased.

For example, in an embodiment, the relative positions between the symmetrical dipole 40*a*, the symmetrical dipole 40*b*, and the symmetrical dipole 40*c* may be arranged in the form of the logarithmic period. For example, the symmetrical dipole 40*a*, the symmetrical dipole 40*b*, and the symmetrical dipole 40*c* may be arranged by satisfying a dimension constraint in the following formula.

$$\frac{d_n}{d_{n+1}} = \hat{o} < 1 \qquad \text{Formula (3)}$$

N is the sequence number of the symmetrical dipole, and increases sequentially from the left end to the right end of the combined line 20. That is, the symmetrical dipole 40*a* is the first symmetrical dipole, the symmetrical dipole 40*b* is the second symmetrical dipole, and the symmetrical dipole 40*c* is the third symmetrical dipole.

$d_n$ is a distance between the $n^{th}$ symmetrical dipole and the $(n+1)^{th}$ symmetrical dipole. $d_{n+1}$ is a distance between the $(n+1)^{th}$ symmetrical dipole and an $(n+2)^{th}$ symmetrical dipole.

$\tau$ is the combination factor of the antenna. In an application, the value of $\tau$ may be appropriately selected based on the actual requirement. For example, the value of $\tau$ may be 0.5, 0.6, 0.7, or the like. This is not limited.

It may be understood that, in an implementation, a plurality of symmetrical dipoles may satisfy only any dimension constraint in the foregoing formulas (1) to (3), or may simultaneously satisfy any one or two or three dimension constraints in the foregoing formulas. In addition, during the specific setting, a quantity of symmetrical dipoles may also be one, three, or more. Parameters such as a disposition position and a size of the symmetrical dipole may also be correspondingly disposed based on an actual condition. This is not limited in the embodiments. Alternatively, in some other implementations, the symmetrical dipole may not be disposed.

Figure 3:
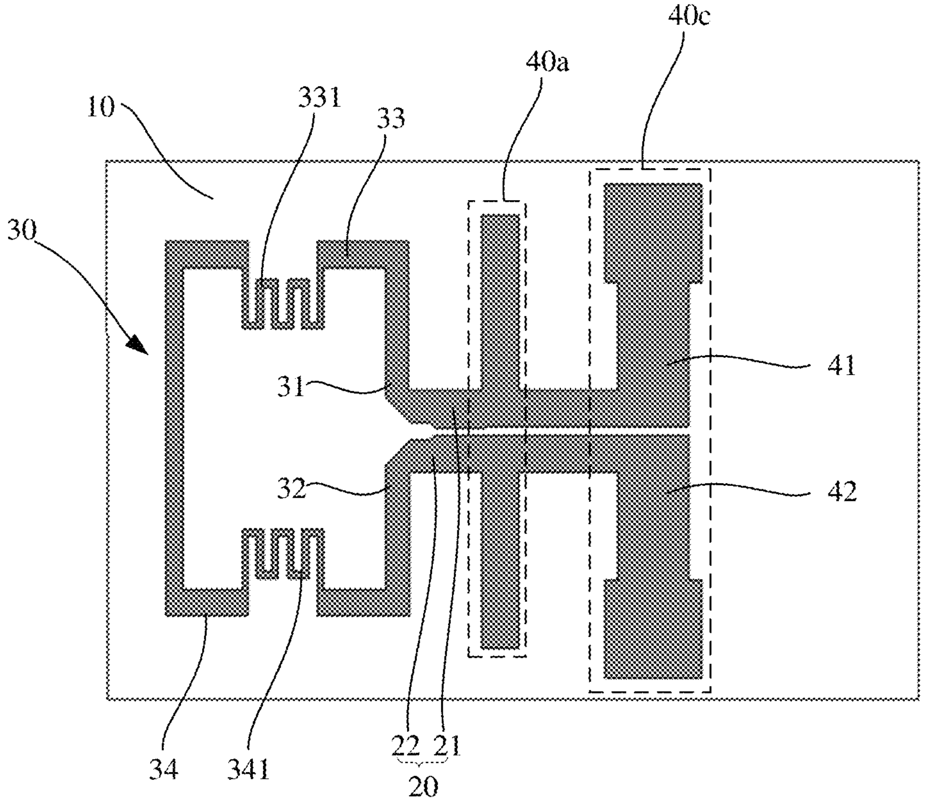
FIG. 3 is a schematic diagram of a planar structure of another antenna according to an embodiment.

For example, as shown in FIG. 3, in an embodiment provided, a symmetrical dipole 40*a* is disposed between a folded dipole 30 and a symmetrical dipole 40*c*. Alternatively, it may be understood that the foregoing symmetrical dipole 40*b* is omitted. In this way, a structure of an antenna is effectively simplified, thereby improving convenience of manufacturing, and effectively reducing manufacturing costs and complexity. In addition, in a specific implementation, the symmetrical dipole 40*c* may further perform overall widening processing or local widening processing. As shown in FIG. 3, in an embodiment, widening processing is performed on an end of a first vibration arm 41, and correspondingly, the widening processing is also performed on an end of a second vibration arm 42. In this manner, radiation performance of a symmetrical dipole 40*c* may be improved, so as to improve a radiation capability of the symmetrical dipole 40*c* to a direction of a folded dipole 30, and bandwidth of the antenna can also be effectively increased.

Figure 4:
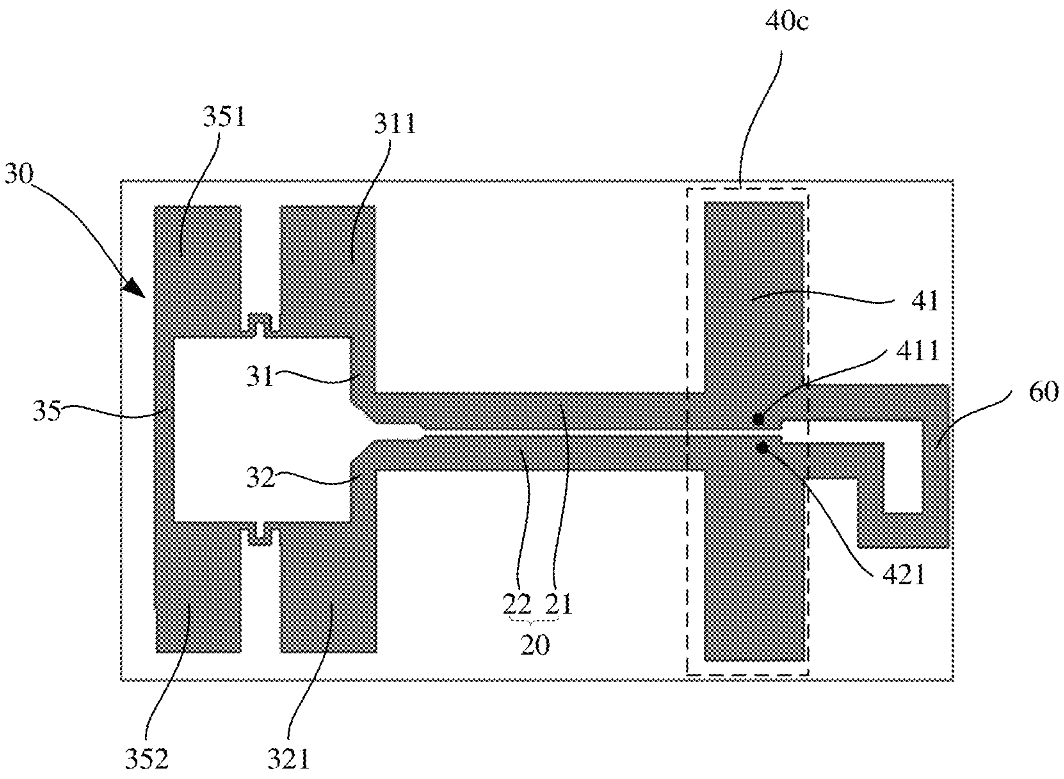
FIG. 4 is a schematic diagram of a planar structure of another antenna according to an embodiment.

Alternatively, as shown in FIG. 4, in another embodiment, an antenna includes a folded dipole 30 and a symmetrical dipole 40*c*. That is, the foregoing symmetrical dipole 40*a* and symmetrical dipole 40*b* are omitted. When the symmetrical dipole 40*a* and the symmetrical dipole 40*b* are omitted, a structure of the antenna can be effectively simplified, thereby improving convenience of manufacturing and effectively reducing manufacturing costs and complexity.

In an implementation, a relatively common folded dipole 30 in a conventional technology may be used for the folded dipole 30, or flexible processing may be performed on the folded dipole 30.

For example, in an embodiment provided, the folded dipole 30 includes a first connecting arm 31, a second connecting arm 32, a third connecting arm 33, and a fourth connecting arm 34. The first connecting arm 31 and the second connecting arm 32 are coaxially disposed, and the first connecting arm 31 and the second connecting arm 32 are symmetrically configured relative to a combined line 20. An end of the first connecting arm 31 is connected to a first microstrip 21, and an end of the second connecting arm 32 is connected to a second microstrip 22. Generally, an operating wavelength of the folded dipole 30 (a wavelength at which the folded dipole 30 transmits or receives electromagnetic waves) is approximately twice a total length of the first connecting arm 31 and the second connecting arm 32. The third connecting arm 33 is provided with a bending structure 331, and the fourth connecting arm 34 is provided with a bending structure 341. The bending structure 331 and the bending structure 341 facilitate miniaturization of the folded dipole 30, thereby reducing a volume of the folded dipole 30. In addition, the bending structure 331 and the bending structure 341 are also beneficial to reduce a resonance frequency of the folded dipole 30, so that the folded dipole 30 is in a normal operating frequency band.

In addition, as shown in FIG. 4, in another embodiment, a first connecting arm 31 of a folded dipole 30 further has a first extension section 311 extending in a direction away from a second connecting arm 32. The second connecting arm 32 has a second extension section 321 extending in a direction away from the first connecting arm 31. Two ends of a fifth connecting arm 35 are respectively provided with a third extension section 351 and a fourth extension section 352. An operating wavelength of the folded dipole 30 may be increased by setting the first extension section 311, the second extension section 321, the third extension section 351, and the fourth extension section 352. Specific lengths of the first extension section 311, the second extension section 321, the third extension section 351, and the fourth extension section 352 may be set based on an actual condition. This is not limited.

It may be understood that, in an application, a structure of the folded dipole 30 may be appropriately selected and adjusted based on different requirements. This is not limited.

Figure 5:
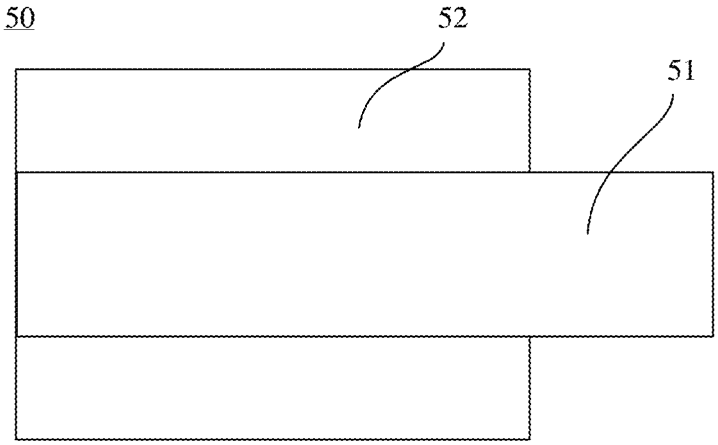
FIG. 5 is a cross-sectional view of a coaxial cable according to an embodiment of this application.

In addition, refer to FIG. 5. In an actual application, an antenna needs to be connected to a signal processing circuit through a coaxial cable 50. The coaxial cable 50 generally includes a cable core 51 and a cylindrical outer conductor 52 wrapped around the periphery of the cable core 51. As an excitation unit of the antenna, a symmetrical dipole 40 needs to be connected to the coaxial cable 50.

Refer to FIG. 4 and FIG. 5. For example, a first feed end 411 is disposed on a first vibration arm 41 of a symmetrical dipole 40, and a second feed end 421 is disposed on a second vibration arm 42. The first feed end 411 is located at an end that is of the first vibration arm 41 and that is close to the second vibration arm 42. Correspondingly, the second feed end 421 is located at an end that is of the second vibration arm 42 and that is close to the first vibration arm 41.

Considering that a size of the outer conductor 52 of the coaxial cable 50 is greater than a size of the cable core 51, to achieve a good connection between the coaxial cable 50 and the antenna, the antenna may further address a problem of unbalanced feeding using other structure setting.

For example, as shown in FIG. 4, in an embodiment, the antenna further includes a balun structure 60. The balun structure 60 is provided on a side that is of the symmetrical dipole 40*c* and that is away from the folded dipole 30, and is connected to the symmetrical dipole 40*c*.

For example, in an embodiment, the balun structure 60 is a bent U-shaped structure. One end of the U-shaped structure is connected to the first vibration arm 41, and the other end of the U-shaped structure is connected to the second vibration arm 42.

During specific disposition, when the first feed end 411 is connected to an inner conductor 51 of the coaxial cable 50, and the second feed end 421 is connected to the outer conductor 52 of the coaxial cable 50, to balance feeding between the symmetrical dipole 40 and the coaxial cable 50, the U-shaped structure may be bent in a direction in which the second vibration arm 42 extends.

When the first feed end 411 is connected to the outer conductor 52 of the coaxial cable 50, and the second feed end 421 is connected to the inner conductor 51 of the coaxial cable 50, to balance feeding between the symmetrical dipole 40 and the coaxial cable 50, the U-shaped structure may be bent in a direction in which the first vibration arm 41 extends.

It may be understood that in an implementation, a specific size and a structural form of the balun structure 60 may be adaptively adjusted based on an actual requirement. This is not limited.

In addition, to balance feeding between the antenna and the coaxial cable, the antenna may further be provided with other structures.

Figure 6:
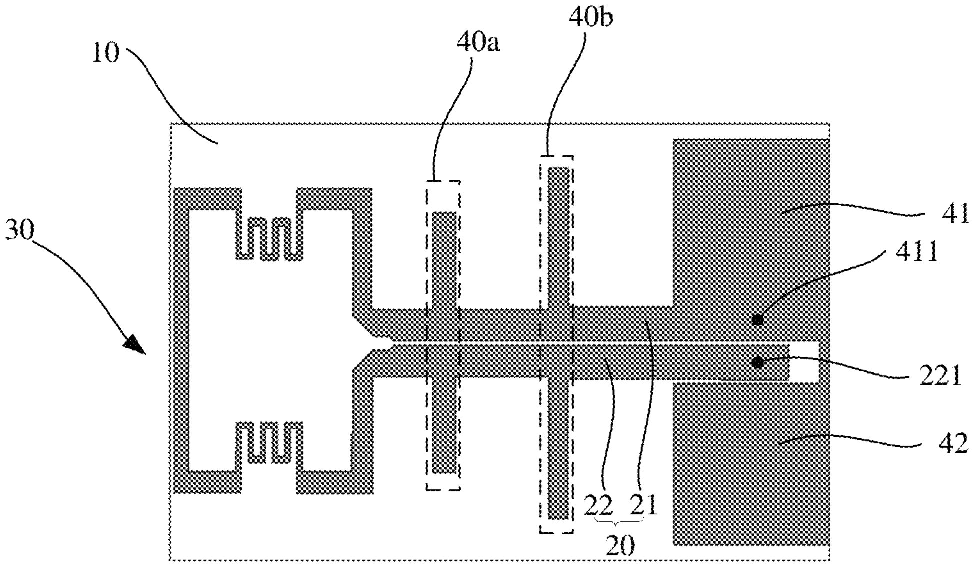
FIG. 6 is a schematic diagram of a planar structure of another antenna according to an embodiment.

For example, as shown in FIG. 6, in an embodiment, a slot is formed between a first vibration arm 41 and a second vibration arm 42, and an end (right end) of a second microstrip 22 extends into the slot. During connecting, an outer conductor 52 of a coaxial cable 50 may be connected to a feed end 411 of the first vibration arm 41, and an inner conductor 51 of the coaxial cable 50 may be connected to a feed end 221 on the second microstrip 22. Therefore, feeding is performed between an antenna and the coaxial cable 50 by implementing a coplanar waveguide, to balance feeding between the antenna and the coaxial cable 50.

Figure 7:
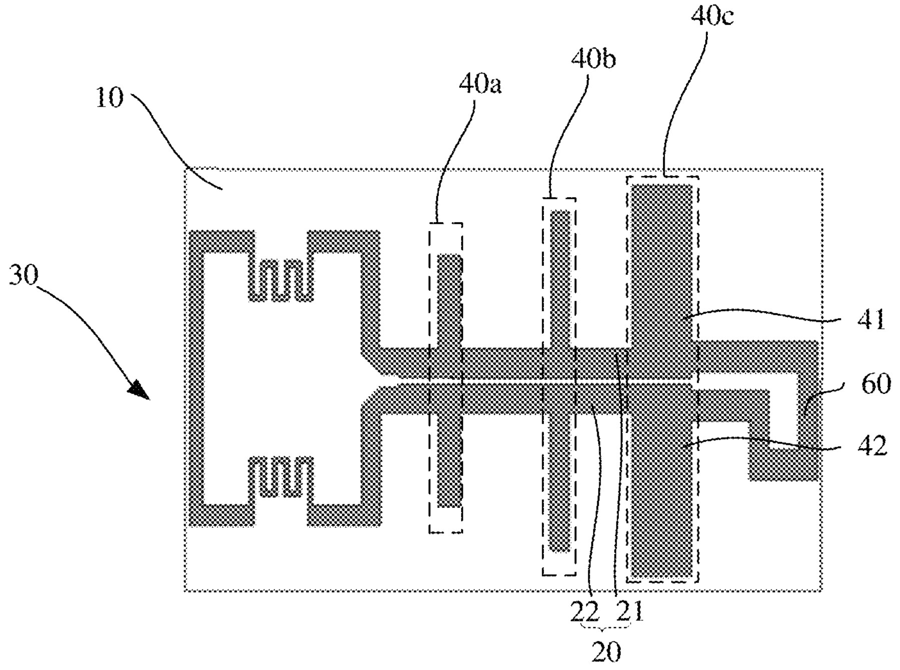
FIG. 7 is a schematic diagram of a planar structure of another antenna according to an embodiment.

The following uses an antenna shown in FIG. 7 as an example to describe advantageous effects of the antenna using experimental data.

In FIG. 7, the antenna includes a symmetrical dipole 40*a*, a symmetrical dipole 40*b*, a symmetrical dipole 40*c*, and a folded dipole 30. A distance between the symmetrical dipole 40*c* and the folded dipole 30 is approximately equal to half of an operating wavelength of the antenna. The symmetrical dipole 40*a*, the symmetrical dipole 40*b*, and the symmetrical dipole 40*c* are sequentially arranged from left to right. The three symmetrical dipoles are disposed to satisfy dimension constraints in the foregoing formulas (1) to (3).

Figure 8:
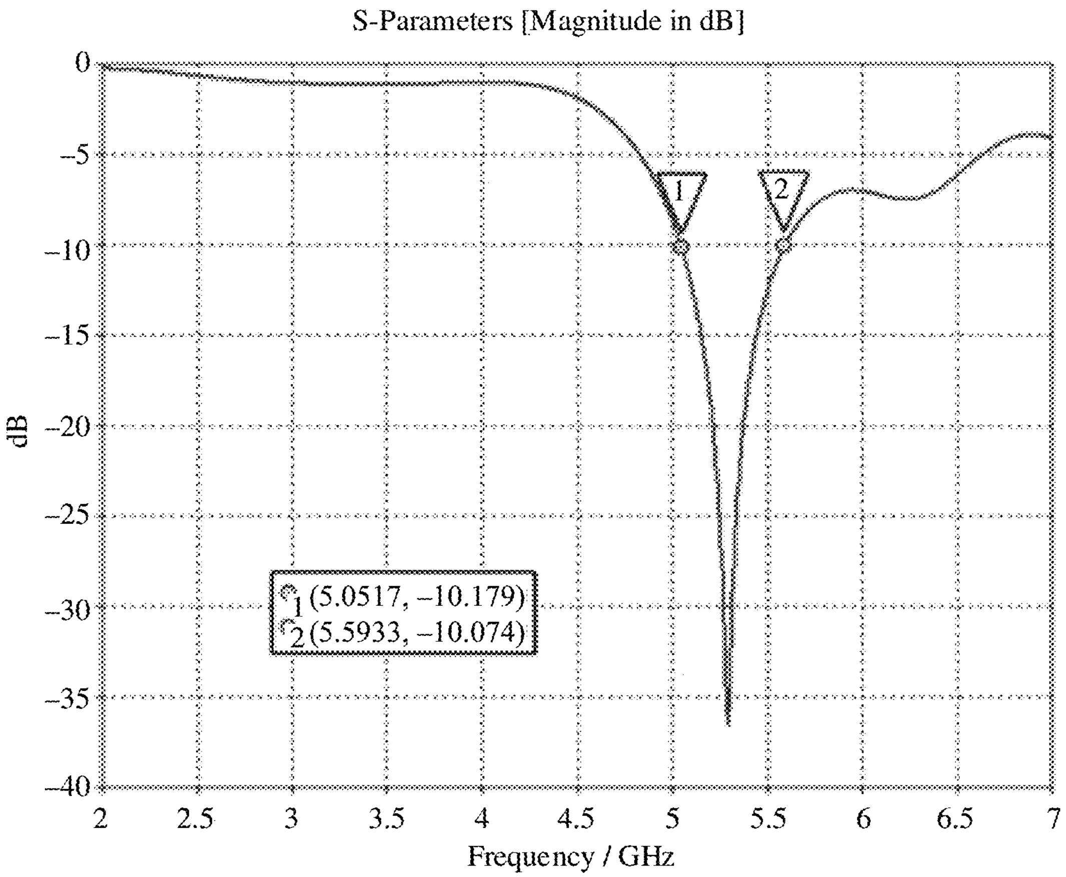
FIG. 8 is a signal simulation diagram of an antenna according to an embodiment.

FIG. 8 shows a signal simulation diagram of an antenna. It can be seen from the figure that an operating frequency band of an antenna is approximately between 5 GHz to 5.6 GHz. For example, coordinates of mark 1 in the figure are approximately (5.0517, −10.179) and mark 2 are approximately (5.5933, −10.074). In the industry, a frequency less than ~10 dB is usually considered as an effective power frequency of the antenna. Therefore, in the antenna provided in the embodiments, an effective operating frequency band of the antenna is approximately between 5 GHz to 5.6 GHz.

Figure 9:
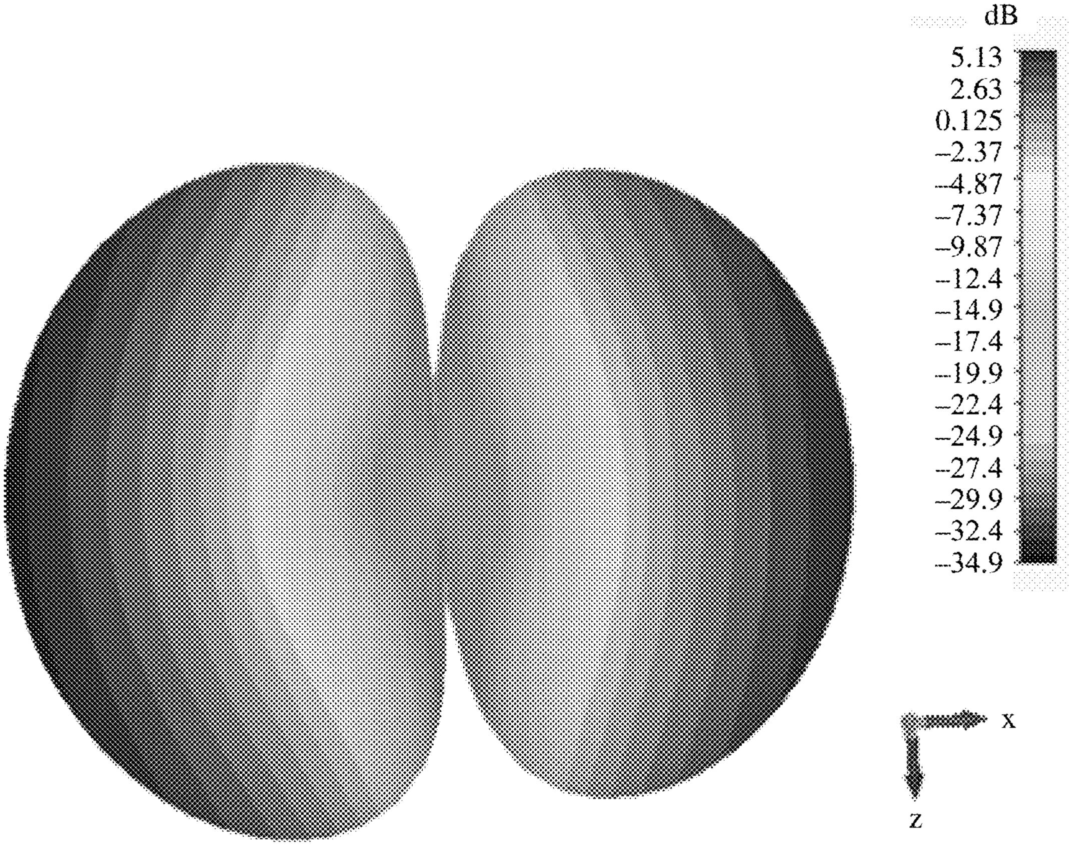
FIG. 9 is a simulation diagram of radiation intensity of an antenna according to an embodiment.
Figure 10:
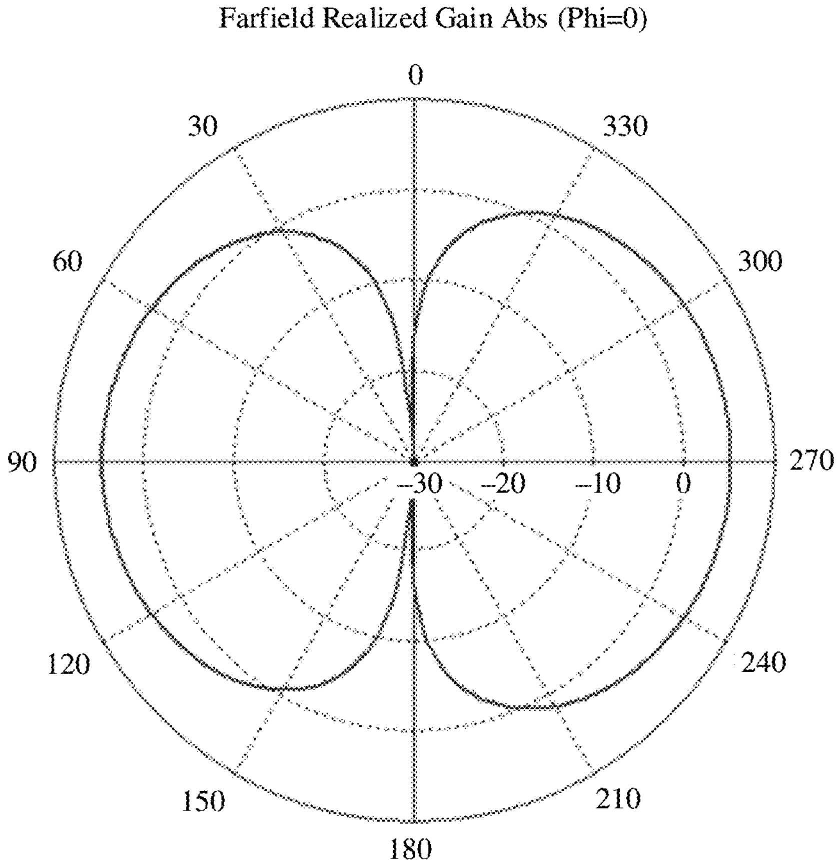
FIG. 10 is an antenna radiation pattern corresponding to FIG. 9.
Figure 11:
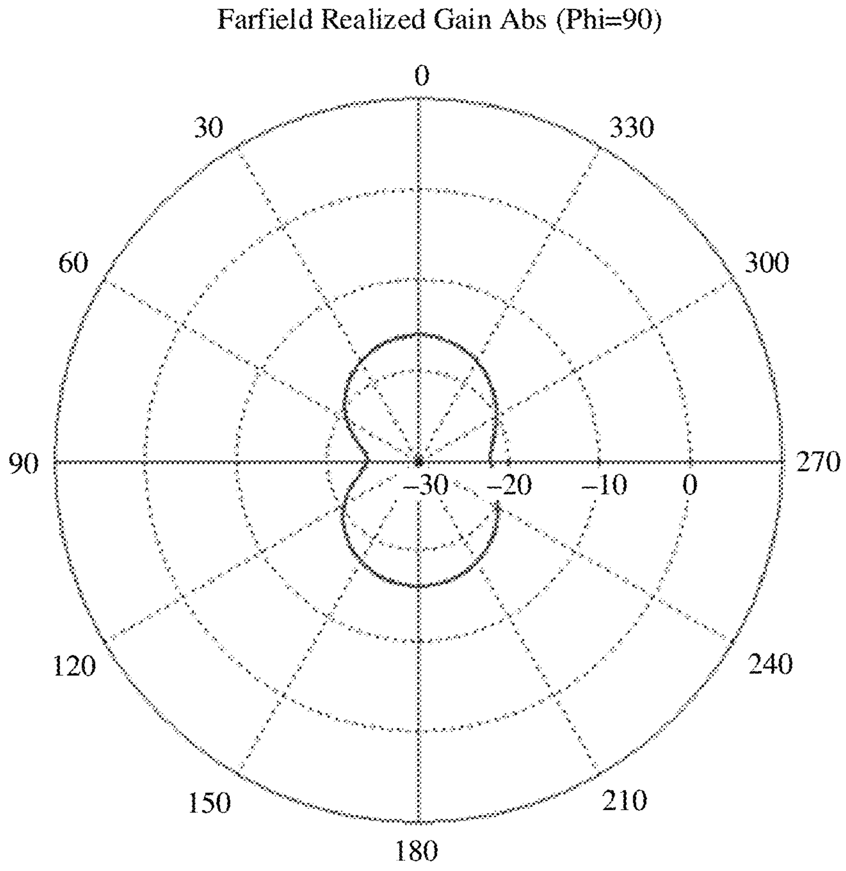
FIG. 11 is a radiation pattern of an antenna in another direction according to an embodiment.
Figure 12:
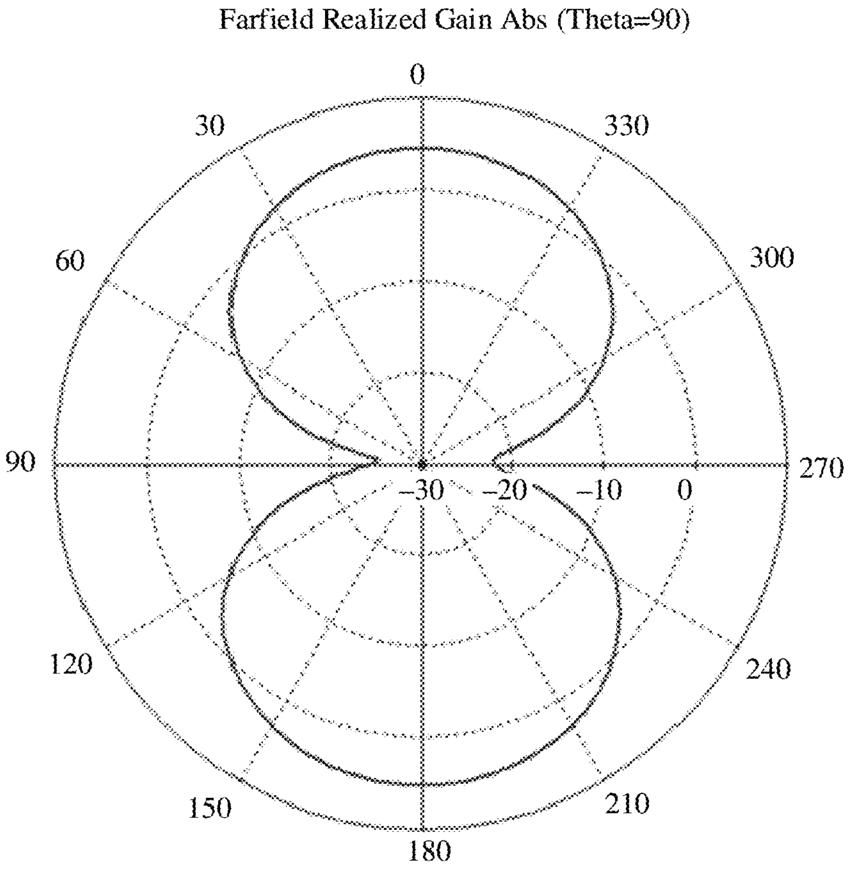
FIG. 12 is a radiation pattern of an antenna in another direction according to an embodiment.

FIG. 9 shows a data simulation diagram of antenna radiation intensity in an X-Z direction. FIG. 10 shows an antenna radiation pattern on X—O—Z. FIG. 11 shows an antenna radiation pattern (also referred to as a directional pattern) on X—O—Y. FIG. 12 shows an antenna radiation pattern on Y—O—Z. That is, in a three-dimensional spatial range, a radiation signal of an antenna presents a dual-beam characteristic.

Thus, according to the antenna provided in the embodiments, a multi-directional radiation range can be achieved in the three-dimensional spatial range, and a multi-beam characteristic can be achieved, thereby improving use effects of the antenna.

In addition, an embodiment further provides a communication device. The communication device includes the foregoing antenna. The communication device may be an optical network unit (ONU), an access point (AP), or a station (STA), a wireless router, a mobile phone, a tablet computer, or any other electronic devices that use the foregoing antenna. Alternatively, the communication device may be a module that includes the foregoing antenna, or the like. The communication device may further include a signal processing circuit. The signal processing circuit is electrically connected to the antenna to input or output a radio frequency signal. The signal processing circuit may be electrically connected to the antenna through a transmission medium. The transmission medium may be, for example, a coaxial cable or any other medium. The electronic device has better antenna performance, and is capable of achieving a relatively wide frequency band and omnidirectional coverage.

The foregoing descriptions are merely implementations of the embodiments, but are not intended as limiting. Any variation or replacement readily figured out by a person skilled in the art shall fall within the scope of this embodiments.

What is claimed is:

1. An antenna, comprising:

a dielectric substrate;

a combined line disposed on the dielectric substrate, wherein the combined line has a first end and a second end;

a folded dipole disposed on the dielectric substrate, wherein the folded dipole is located at the first end of the combined line and is connected to the combined line; and N symmetrical dipoles disposed on the dielectric substrate, wherein the N symmetrical dipoles are connected to the combined line, and N is an integer greater than or equal to 1, and when N is greater than 1, the N symmetrical dipoles are sequentially arranged from the first end to the second end of the combined line, wherein the combined line comprises a first microstrip and a second microstrip, the first microstrip and the second microstrip are provided in parallel, and a gap exists between the first microstrip and the second microstrip, wherein the folded dipole comprises a first connecting arm and a second connecting arm, the first connecting arm is connected to an end of the first microstrip, and the second connecting arm is connected to an end of the second microstrip, wherein the first connecting arm has a first extension section extending in a direction away from the second connecting arm, and the second connecting arm has a second extension section extending in a direction away from the first connecting arm.

2. The antenna according to claim 1, wherein a distance between the folded dipole and the symmetrical dipole at a tail part is L;

the symmetrical dipole at the tail part is a symmetrical dipole located at a second end of the combined line; and L ranges from a quarter of an operating wavelength of the antenna to an entire operating wavelength.

3. The antenna according to claim 2, wherein L is equal to half of the operating wavelength of the antenna.

4. The antenna according to claim 3, wherein the combined line comprises a first microstrip and a second microstrip; and the first microstrip and the second microstrip are provided in parallel, and a gap exists between the first microstrip and the second microstrip.

5. The antenna according to claim 2, wherein the combined line comprises a first microstrip and a second microstrip; and the first microstrip and the second microstrip are provided in parallel, and a gap exists between the first microstrip and the second microstrip.

6. The antenna according to claim 1, wherein the symmetrical dipole comprises a first vibration arm and a second vibration arm, and the first vibration arm and the second vibration arm are symmetrically configured relative to the combined line; and the first vibration arm is located on a side of the first microstrip and an end that is of the first vibration arm and that is close to the first microstrip is connected to the first microstrip; and the second vibration arm is located on a side of the second microstrip and an end that is of the second vibration arm and that is close to the second microstrip is connected to the second microstrip.

7. The antenna according to claim 6, wherein in the symmetrical dipole at the tail part, the first vibration arm has a first feed end, and the first feed end is located at an end that is of the first vibration arm and that faces the second vibration arm;

the second vibration arm has a second feed end, and the second feed end is located at an end that is of the second vibration arm and that faces the first vibration arm; and the symmetrical dipole at the tail part is a symmetrical dipole located at the second end of the combined line.

8. The antenna according to claim 6, wherein the folded dipole comprises a first connecting arm and a second connecting arm, the first connecting arm is connected to an end of the first microstrip, and the second connecting arm is connected to an end of the second microstrip.

9. The antenna according to claim 7, wherein the antenna further comprises a balun structure; and the balun structure is disposed on a side that is of the symmetrical dipole at the tail part and that is away from the folded dipole, and is connected to the symmetrical dipole at the tail part.

10. The antenna according to claim 7, wherein the folded dipole comprises a first connecting arm and a second connecting arm, the first connecting arm is connected to an end of the first microstrip, and the second connecting arm is connected to an end of the second microstrip.

11. The antenna according to claim 9, wherein the balun structure is a bent U-shaped structure; and one end of the balun structure is connected to the first vibration arm, and the other end is connected to the second vibration arm.

12. The antenna according to claim 9, wherein the folded dipole comprises a first connecting arm and a second connecting arm, the first connecting arm is connected to an end of the first microstrip, and the second connecting arm is connected to an end of the second microstrip.

13. The antenna according to claim 1, wherein the symmetrical dipole at the tail part comprises a first vibration arm and a second vibration arm, and the first vibration arm and the second vibration arm are symmetrically configured relative to the combined line;

an end close to the first vibration arm and an end close to the second vibration arm are connected to each other, and a slot exists between the first vibration arm and the second vibration arm;

an end that is of the first vibration arm and that is close to the first microstrip is connected to the first microstrip, and an end of the second microstrip is located in the slot; and the symmetrical dipole at the tail part is a symmetrical dipole located at a second end of the combined line, the first vibration arm or the second vibration arm has a first feed end, and the second microstrip has a second feed end.

14. The antenna according to claim 1, wherein the N symmetrical dipoles satisfy:

$$\frac{L_n}{L_{n+1}} = < 1$$

wherein n is a sequence number of the symmetrical dipole and increases sequentially from the first end to the second end of the combined line; $L_n$ is a length of an $n^{th}$ symmetrical dipole; $L_{n+1}$ is a length of an $(n+1)^{th}$ symmetrical dipole; and τ is a combination factor of the antenna.

15. The antenna according to claim 1, wherein the N symmetrical dipoles satisfy:

$$\frac{R_n}{R_{n+1}} = \hat{o} < 1$$

wherein n is the sequence number of the symmetrical dipole and increases sequentially from the first end to the second end of the combined line; $R_n$ is a distance from the $n^{th}$ symmetrical dipole to a virtual vertex of the antenna; $R_{n+1}$ is a distance from the $(n+1)^{th}$ symmetrical dipole to the virtual vertex of the antenna; and τ is the combination factor of the antenna.

16. The antenna according to claim 1, wherein the N symmetrical dipoles satisfy:

$$\frac{d_n}{d_{n+1}} = \hat{o} < 1$$

wherein n is the sequence number of the symmetrical dipole and increases sequentially from the first end to the second end of the combined line; $d_n$ is a distance between the $n^{th}$ symmetrical dipole and the $(n+1)^{th}$ symmetrical dipole; $d_{n+1}$ is a distance between the $(n+1)^{th}$ symmetrical dipole and the $(n+2)^{th}$ symmetrical dipole; and τ is the combination factor of the antenna.

17. A communication device, comprising:

a signal processing circuit and an antenna, wherein the signal processing circuit is electrically connected to the antenna;

the antenna comprises a dielectric substrate, a combined line, a folded dipole, and N symmetrical dipoles, the combined line is disposed on the dielectric substrate, and the combined line has a first end and a second end;

the folded dipole is disposed on the dielectric substrate, and the folded dipole is located at the first end of the combined line and is connected to the combined line; and the N symmetrical dipoles are disposed on the dielectric substrate, the N symmetrical dipoles are connected to the combined line, and N is an integer greater than or equal to 1, and when N is greater than 1, the N symmetrical dipoles are sequentially arranged from the first end to the second end of the combined line, wherein the combined line comprises a first microstrip and a second microstrip, the first microstrip and the second microstrip are provided in parallel, and a gap exists between the first microstrip and the second microstrip, wherein the folded dipole comprises a first connecting arm and a second connecting arm, the first connecting arm is connected to an end of the first microstrip, and the second connecting arm is connected to an end of the second microstrip, wherein the first connecting arm has a first extension section extending in a direction away from the second connecting arm, and the second connecting arm has a second extension section extending in a direction away from the first connecting arm.

* * * * *